Aug. 1, 1961 E. PASKELL 2,994,628

SEMICONDUCTOR DEVICES AND THEIR MANUFACTURE

Original Filed March 27, 1957

INVENTOR.
Ernest Paskell
BY James F. Ryan
Attorney

United States Patent Office 2,994,628

Patented Aug. 1, 1961

2,994,628
SEMICONDUCTOR DEVICES AND THEIR MANUFACTURE

Ernest Paskell, Grove City, Ohio, assignor to Battelle Memorial Institute, Columbus, Ohio, a corporation of Ohio Original application Mar. 27, 1957, Ser. No. 648,964, now Patent No. 2,964,435, dated Dec. 13, 1960. Divided and this application Dec. 1, 1959, Ser. No. 862,739
13 Claims. (Cl. 148—1.5)

The present invention relates generally to semiconductor devices and particularly to an improved method of preparing junction type semiconductor devices. More particularly the invention concerns a process by which a large area junction type semiconductor device having particular application in the field of over-voltage protection of electric circuits is prepared.

In recent years, advances in technology have led to the development of improved electronic devices, such as transistors and crystal rectifiers, based on single crystals of semiconductors; for example, germanium and silicon. Very recently, the reverse breakdown characteristic in silicon rectifiers fabricated from single crystals has been studied. The characteristic exhibited is a very sharp "breakdown" which is associated with electronic processes and does not result in permanent changes in the rectifier characteristics. It has been concluded that this breakdown is caused by the high fields associated with P-N junctions and collision ionization (as opposed to thermal ionization) which results in electron avalanching (similar to Townsend discharges in gaseous tubes). This process results in an extremely non-linear voltage-current characteristic with the voltage being practically independent of the current in the breakdown region. Since this is the desired characteristic of surge protectors, such as lightning arresters, rectifiers based on silicon single crystals have recently been proposed for surge protectors.

The present invention provides an improved design in manufacturing procedure for junction type semiconductor devices having particular application for use as surge protectors or lightning arresters based on the above outlined principle.

From a theoretical standpoint, the utilization of the reverse breakdown characteristic of a silicon P-N junction rectifier should provide an ideal surge protector. However, in practice, it is found that the large cross-sectional areas required for the currents involved in surges (up to thousands of amperes) and undesirable effects (which act to short circuit the junction) seriously reduce the non-linearity and, hence, the operating efficiency of the device. Neither remote nor surface imperfections which reduce the non-linearity of the reverse characteristics are well understood today. However, the surface effects are judged to be an important limiting factor in the utilization of silicon P-N junctions for surge protection and also in the use of junctions as rectifiers.

In the device, as it is presently conceived, the junction terminates at the surface of the silicon with dimensions and concentrations of added doping agents comparable to the junction in the interior of the crystal. This results in an extremely high surface field (of the order of $10^5$ volts per centimeter at breakdown). Since, by its very nature, the surface of a single crystal is less perfect than the bulk, this high field causes local surface breakdown at a lower applied voltage than is required for breakdown of the interior junction. These localized surface breakdowns will, therefore, carry current prior to the breakdown of the bulk P-N junction. Since the initial currents will be limited to the surface, a significant amount of heating could occur at these localized areas of surface breakdowns. When these areas become heated above 200° C. the characteristics of the P-N junction at the surface deteriorates rapidly, and the current associated with the surge will flow through these localized surface breakdown paths. This generally results in destruction of the device when large currents are encountered.

Since surge protectors are frequently required to conduct large currents, the probability of destruction of the device is high. This results in a high failure rate of the protectors.

Several additional problems are associated with the high surface fields. If the unit is hermetically sealed in an inert gas, surface flashover can occur because of dielectric breakdown in the gaseous ambient. If organic materials are utilized for minimizing surface flashover, these materials must be non-polar, non-ionic, and completely non-reactive, as well as being stable for many years against the effects of high fields and wide variations in ambient temperature.

To circumvent the shortcomings of previously proposed designs, an improved design is herein described and claimed, the principal feature of said improved design being the reduction of the high surface field. The principle involved in fabricating a device of this type will be termed "multiple solid state diffusion." The process of manufacture is described in connection with the single drawing, in which:

Figure 1:
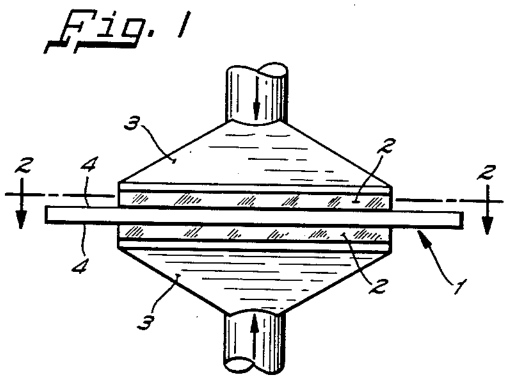
FIG. 1 is an elevational view of a fixture or jig used in conducting the process for preparing the junction type semiconductor of the present invention.
Figure 2:
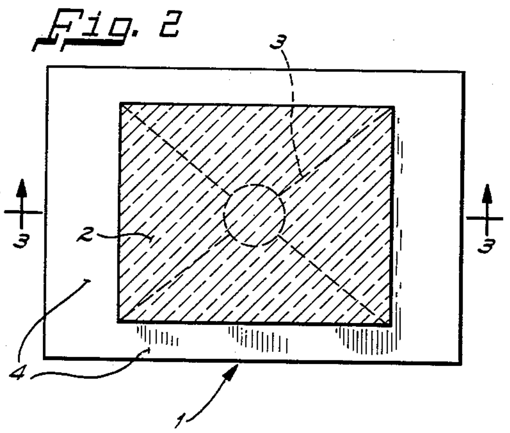
FIG. 2 is a cross-sectional view taken on lines 2—2 of FIG. 1.

The process of manufacture in accordance with the present invention is described in connection with the drawing, in which FIG. 1 illustrates a wafer or slice of single-crystal semiconductor material of silicon, or other suitable semiconductor such as AlSb, and designated herein by the reference numeral 1. The crystal 1 is of high resistivity of either conductivity type and prepared in accordance with the usual procedure of crystal growth. The sample is lapped or ground to size, which is usually less than 10 mils to reduce the amount of ohmic resistance material. The crystal slice 1 of the semiconductor material is jigged with flat quartz masking plates 2 disposed at opposed sides of the slice. The assembly of the semiconductor and the masking plates are placed under slight mechanical pressure between opposed graphite or high-melting-point metallic jigs 3. The jigged assembly is then placed in a furnace (not shown) and arranged so that the uncovered areas 4 of the semiconductor are exposed to the furnace ambient (see FIG. 2). This arrangement provides a means for accurately controlling the geometry of the diffused layer which is essential for the present invention.

It will be apparent that only one side of the slice may be masked if so desired (not shown). This would have particular application in the preparation of power rectifier semiconductor devices.

After arranging the jigged assembly in the furnace, an appropriate gaseous material, or sublimate, is caused to flow over the jigged semiconductor material at an elevated temperature. It will be apparent that a certain amount of the gaseous material will be absorbed or otherwise taken up by the exposed surface of the semiconductor. Appropriate materials for use with silicon are, for example, boron trichloride for N-type material, or phosphorous or antimony-containing materials for P-type semiconductors. These elements will be taken up by the surface of the semiconductor in accordance with the solubility limit at the temperature used.

The material deposited on the surface of the semiconductor is then permitted to diffuse into the interior for a predetermined length of time, depending upon the impurity gradient and breakdown voltage desired. For example, in 16 hours at 1200° C., phosphorus will diffuse into P-type silicon and cause a layer of silicon about one mil in thickness to be converted to N-type, thus creating a silicon P-N junction. This will result in a "graded" junction and will exhibit a significantly higher breakdown voltage than a "sharp" impurity gradient junction.

To create the lower breakdown voltage junction, the quartz masking plate 2 is removed from the semiconductor slice, or wafer 1, and the solid state diffusion process is continued for a predetermined period of time, which is relatively short compared to the original diffusion time. It will be apparent that in both diffusion periods, the source of diffusant is a gaseous or vapor phase which impinges on the surface of the wafer, and is taken into solution by the surface layer which then acts as a source. The edges of the slice 1 are then trimmed, and the semiconductor is cleaned, etched, and encapsulated, according to accepted procedure for semiconductor devices.

Figure 3:
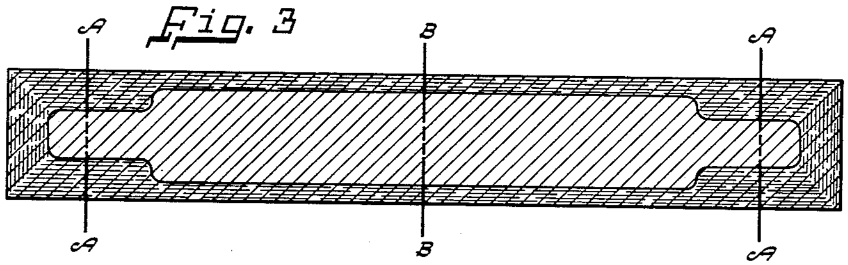
FIG. 3 is a vertical section taken on lines 3—3 of FIG. 2.

FIG. 3 is a pictorial representation of the distribution of the diffused impurities in the cross-section of the slice. The concentration of impurities in the "graded" junction is highest at the horizontal surfaces of the wafer and decreases in a vertical direction toward the interior of the slice in accordance with curve A of FIG. 4.

After the sections A—A are trimmed, the junctions exposed at the wafer edges will be the cross-section of the "graded" junction.

Figure 4:
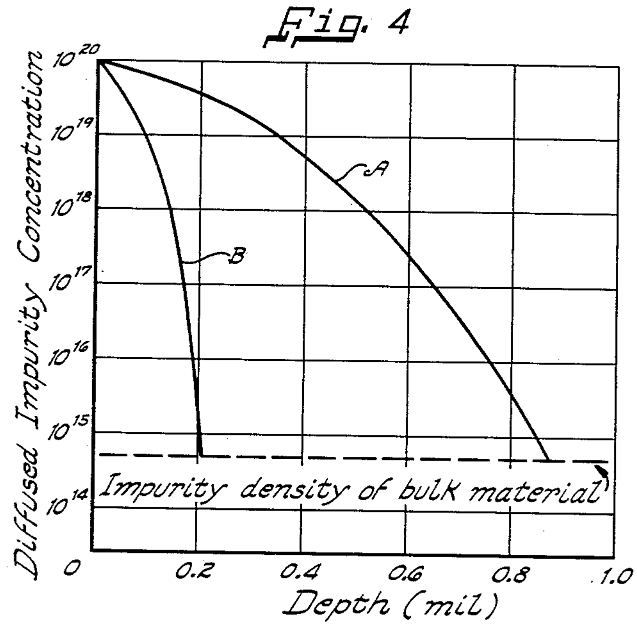
FIG. 4 is a plotted graph of the diffused impurity concentration of an article made in accordance with the present invention, versus depth of the article in mils.

Impurity concentration in the "sharp" junction varies in accordance with curve B of FIG. 4.

The "breakdown" voltage of the "sharp" junction will be lower than for the "graded" junction so that breakdown will always occur well within the body of the slice. It can be shown theoretically that for the illustrated case, the breakdown voltage is proportional to the square root of the junction depth. For the two junctions illustrated, the ratio of the breakdown voltages should be greater than 2:1 with the interior junction breaking down at the lower voltage.

The lower voltage field across the "graded" junction results in a lower voltage stress across the surface of the junction at the crystal edges than if the "sharp" junction were applied across the entire crystal surface. The result is that the flashover voltage of the junction surface is increased, preventing flashover and current conduction over the surface with resulting destruction of the junction. Thus "breakdown" of the junction will always be in the crystal interior.

It will be apparent that when the process is used for manufacturing power rectifiers, the completed silicon single-crystal P-N junction device may be provided preferably from a P-type silicon slab or slice with the impurities being diffused into one side with an N-type gaseous material containing phosphorus. This can be accomplished by masking one surface during the entire diffusing process. N-type silicon can be similarly used for rectifier manufacture if a gaseous material containing boron is used instead of one containing phosphorous.

In the case of devices used for lightning or surge protectors, the lightning protectors will dissipate the energy of high voltage surges, but allow equipment which they are protecting to function normally under ordinary operating conditions. The large area silicon P-N-P junction made in accordance with the present invention is ideal for this purpose. It has a high resistance at all voltages below breakdown, but under high current surges, the voltage rise will be limited. The protector is equally effective for surges of either polarity and will dissipate the energy of high amperage pulses of short duration, such as those present in lightning surges. The protector may also be made by diffusing acceptor impurities into an N-type silicon slab or slice with a gaseous material containing boron or other group III elements. In this case, the device would be an P-N-P structure.

I claim:

1. In the process of preparing a semiconductor device, the steps comprising; selecting a section of single crystal semiconductor material of a prescribed conductivity type, reducing the thickness of said section to substantially the desired semiconductor cross-section, masking a portion of at least one side of said section with the remainder of said section being exposed to atmosphere, subjecting said section to an atmosphere which is capable of transforming said exposed surfaces to a conductivity type of opposite nature to said prescribed conductivity type for a time sufficient to accomplish same, removing said masking from said portion of said section, subjecting the entire surface area of said section to said atmosphere for an additional period of time which is relatively short compared to the original length of time, and trimming the edges of said section, whereby integral parallel junctions are created which exhibit relatively diverse breakdown voltages.

2. In the process of preparing a semiconductor device, the steps comprising; selecting a section of single crystal semiconductor material of a prescribed conductivity type, reducing the thickness of said section to reduce the ohmic resistance thereof, masking a first portion of said section with a second portion of said section being exposed to atmosphere, depositing a diffusing material containing impurities on said second portion, allowing said diffusing material to diffuse into the interior of said second portion to create a graded junction which exhibits a relatively high breakdown voltage, removing said masking from said first portion, depositing said diffusing material on at least said first portion, allowing said diffusing material to diffuse into said first portion to create a sharp junction which exhibits a breakdown voltage which is lower than that of said graded junction, and trimming the edges of said section.

3. In the process of preparing a semiconductor device, the steps comprising; selecting a section of single crystal semiconductor material of a prescribed conductivity type, reducing the thickness of said section to the desired semiconductor cross-section, masking opposed sides of said section with the exception of marginal surface portions which are exposed to atmosphere, maintaining said section at an elevated temperature in an atmosphere of a diffusing material containing impurities capable of transforming said exposed portions to a conductivity type of opposite nature to said prescribed conductivity type for a length of time sufficient to create a graded P-N junction therein, removing said masking from opposed sides of said section, exposing the entire surface area of said section to said atmosphere for an additional period of time which is relatively short compared to the length of time sufficient to create said graded junction, and trimming the edges of said section, whereby integral parallel junctions are created, one of which exhibits a higher breakdown voltage than the other.

4. In the process of preparing a semiconductor device, the steps comprising; selecting a section of single crystal semiconductor material of N-type conductivtiy, reducing the thickness of said section, masking a portion of at least one side of said section with the remainder of said section being exposed to atmosphere, heating said section in an atmosphere of a diffusing acceptor material containing impurities capable of transforming said exposed portions to a P-type conductivity for a length of time sufficient to accomplish same, removing said masking from said section, exposing the entire surface area of said section to said atmosphere for an additional period of time which is relatively short compared to the original length of time, and trimming the edges of said section, thereby providing a single-crystal semiconductor with integral parallel junctions having different breakdown voltages.

5. The process of claim 4, wherein the semiconductor material is N-type silicon and the acceptor material comprises boron trichloride.

6. The process of claim 4, wherein the semiconductor is P-type aluminum antimonide and the donor material comprises zinc.

7. In the process of preparing a semiconductor device, the steps comprising; selecting a section of single crystal semiconductor material of P-type conductivity, reducing the thickness of said section, masking a portion of at least one side of said section with the remainder of said section being exposed to atmosphere, heating said section in an atmosphere of diffusing donor material containing impurities capable of transforming said exposed portions to a N-type conductivity for a length of time sufficient to accomplish same, removing said masking from said section, exposing the entire surface area of said section to said atmosphere for an additional period of time which is relatively short compared to the original length of time, and trimming the edges of said section, thereby providing a single-crystal semiconductor with integral parallel junctions having different breakdown voltages.

8. The process of claim 7, wherein the semiconductor material is silicon of the P-type and the donor material comprises phosphorous.

9. The process of claim 7, wherein the semiconductor material is silicon of the P-type and the donor material comprises antimony.

10. The process of claim 7, wherein the semiconductor is P-type aluminum antimonide and the donor material comprises zinc.

11. In the process of preparing a semiconductor device, the steps comprising; selecting a section of single crystal semiconductor material of P-type conductivity reducing the thickness of said section to substantially the desired semiconductor cross-section, masking portions of opposed sides of said section with the remainder of the surface of opposed sides being exposed to atmosphere, maintaining said section at a temperature of 1200° C. for a period of 16 hours in an atmosphere of a diffusing material containing phosphorous capable of transforming said exposed surfaces to an N-type conductivity, removing said masking from opposed sides of said section, exposing the entire surface area of said section to said atmosphere for an additional time period of less than 16 hours, and trimming the edges of said section.

12. In the process of preparing a semiconductor device, the steps comprising; selecting a section of single-crystal semiconductor material of a prescribed conductivity type, reducing the thickness of said section to substantially the desired semiconductor thickness to reduce the ohmic resistance thereof, assembling said section between masking plates of substantially identical contour and in register relative to one another at opposed side portions of said section with the remainder of said sides being exposed to atmosphere, positioning said assembly in a jig under sufficient pressure to maintain a fluid seal between said masking members and respective unexposed portions of said section, heating said jigged assembly in an atmosphere of a diffusing material containing impurities for a sufficient time to transform said exposed surfaces to a conductivity type of opposite nature to said prescribed conductivity type, removing said section from said masking members and continuing said heating step in said atmosphere for a relatively shorter time period than said original time period, trimming the edges of said section, cleaning and etching said section and encapsulating said section to provide said semiconductor device.

13. In the process of preparing a semiconductor device, the steps comprising; selecting a section of single-crystal silicon semiconductor material of the P-type conductivity, reducing the thickness of said section to substantially the desired semiconductor thickness to reduce the ohmic resistance thereof, assembling said section between masking plates of substantially identical contour and in register relative to one another at opposed side portion of said section with the remainder of said sides being exposed to atmosphere, positioning said assembly in a jig under sufficient pressure to maintain a fluid seal between said masking members and respective unexposed portions of said section, heating said jigged assembly at a temperature of 1200° C. for a period of 16 hours in an atmosphere of a diffusing material containing phosphorous capable of transforming said exposed surfaces to N-type conductivity, removing said section from said masking members and continuing said heating step in said atmosphere for a relatively shorter time period than said original time period, trimming the edges of said section, cleaning and etching said section and encapsulating said section to provide said semiconductor device.

References Cited in the file of this patent

UNITED STATES PATENTS 2,841,510 Mayer ---------------- July 1, 1958

UNITED STATES PATENT OFFICE
CERTIFICATE OF CORRECTION

Patent No. 2,994,628 August 1, 1961

Ernest Paskell

It is hereby certified that error appears in the above numbered patent requiring correction and that the said Letters Patent should read as corrected below.

In the grant, lines 1 to 3, for "assignor to Battelle Memorial Institute, of Columbus, Ohio, a corporation of Ohio," read -- assignor, by mesne assignments, to McGraw-Edison Company, of Milwaukee, Wisconsin, a corporation of Delaware, --; line 12, for "Battelle Memorial Institute, its successors" read -- McGraw-Edison Company, its successors --; in the heading to the printed specification, lines 4 to 6, for "assignor to Battelle Memorial Institute, Columbus, Ohio, a corporation of Ohio" read -- assignor, by mesne assignments, to McGraw-Edison Company, Milwaukee, Wis., a corporation of Delaware --; column 6, line 31, for "portion" read -- portions --.

Signed and sealed this 27th day of February 1962.

(SEAL)
Attest:

ERNEST W. SWIDER DAVID L. LADD

Attesting Officer Commissioner of Patents